(12) United States Patent
French et al.

(10) Patent No.: US 6,186,890 B1
(45) Date of Patent: Feb. 13, 2001

(54) ELECTRONIC CABINET DOOR AIR MIXING DAM

(75) Inventors: F. William French, Littleton; Lisa D. Tilley, Allston, both of MA (US)

(73) Assignee: EMC Corporation, Hopkinton, MA (US)

( * ) Notice: Under 35 U.S.C. 154(b), the term of this patent shall be extended for 0 days.

(21) Appl. No.: 09/340,261

(22) Filed: Jun. 30, 1999

(51) Int. Cl.$^7$ .................................................. H05K 7/20
(52) U.S. Cl. .......................................... 454/184; 361/695
(58) Field of Search ........................... 454/184; 361/695, 361/678; 174/16.1

(56) References Cited

U.S. PATENT DOCUMENTS

| | | | |
|---|---|---|---|
| 5,544,012 | * | 8/1996 | Koike ................................ 454/184 X |
| 6,052,282 | * | 4/2000 | Sugiyama et al. ................... 454/184 |

FOREIGN PATENT DOCUMENTS

| | | | |
|---|---|---|---|
| 2-65608 | * | 3/1990 | (JP) ..................................... 361/678 |
| 4-209598 | * | 7/1992 | (JP) ..................................... 361/695 |

* cited by examiner

*Primary Examiner*—Harold Joyce
(74) *Attorney, Agent, or Firm*—Daly, Crowley & Mofford, LLP

(57) ABSTRACT

A cabinet having a plurality of compartments disposed in an interior of the cabinet. The interior is configured to house electrical components. The cabinet has a surface with an exhaust aperture formed therethrough. The cabinet has a fan mounted to its surface in registration with the exhaust aperture in the cabinet. The fan is adapted to produce a flow of air through the interior of the cabinet and to exhaust such flow of air externally of the cabinet. A door is disposed adjacent to the plurality of compartments. The door having an intake aperture formed therethrough to allow the passage of air. The door also has an air dam extending out from the door toward the plurality of compartments. The air dam positioned on the door between the intake aperture in the door and the fan mounted in registration with the exhaust aperture in the cabinet. The air dam is adapted to inhibit airflow along the interior door toward the fan. With such an arrangement, the air dam redirects the circulating air to blow through the plurality of compartments housing the electrical components.

4 Claims, 7 Drawing Sheets

ELECTRONIC CABINET DOOR AIR MIXING DAM

BACKGROUND OF THE INVENTION

This invention relates generally to electrical cabinets and more particularly to cooling systems used to cool electrical components housed in such cabinets.

As is known in the art, air is typically used to cool electrical components stored within electrical cabinets. One technique for such cooling is to mount a fan in an aperture in the top of such cabinets. Such a fan creates an air flow through the cabinet, cooling the housed electrical components.

Typically, a flat door is used to seal the components within the cabinet. One type of door enables the fan to draw in air from a gap at the bottom of the door allows air to enter the gap and pass directly between the door and the electronic components stored in said cabinet.

SUMMARY OR THE INVENTION

In accordance with the present invention, a cabinet is provided having a plurality of compartments disposed in an interior of the cabinet. The interior is configured to house electrical components. The cabinet has a surface with an exhaust aperture formed therethrough. The cabinet has a fan mounted to the surface in registration with the exhaust aperture in the cabinet. The fan is adapted to produce a flow of air through the interior of the cabinet and to exhaust such flow of air externally of the cabinet. A door is disposed adjacent to the plurality of compartments. The door has an aperture formed therethrough to allow passage of the flow of air. The door also has an air dam extending from the door toward the plurality of compartments. The air dam is positioned on the door between the aperture in the door and the fan. The air dam is adapted to inhibit the flow of air along the interior door and redirect the flow of air through the plurality of compartments housing the electrical components.

Absent the dam, a low impedance path along the door creates a chimney effect diverting the fan produced airflow away from the components which the air was meant to cool. Such a loss in airflow over the components decreases efficiency in cooling the components, causing them to heat up with use. As a result, the higher temperatures at which these components operate leads to accelerated component failure. With the dam, the flow of air is redirected through the plurality of compartments housing the electrical components.

BRIEF DESCRIPTION OF THE DRAWING

These and other features of the invention will become more readily apparent from the following detailed description when read together with the accompanying drawings, in which.

DESCRIPTION OF THE PREFERRED EMBODIMENTS

Figure 1:
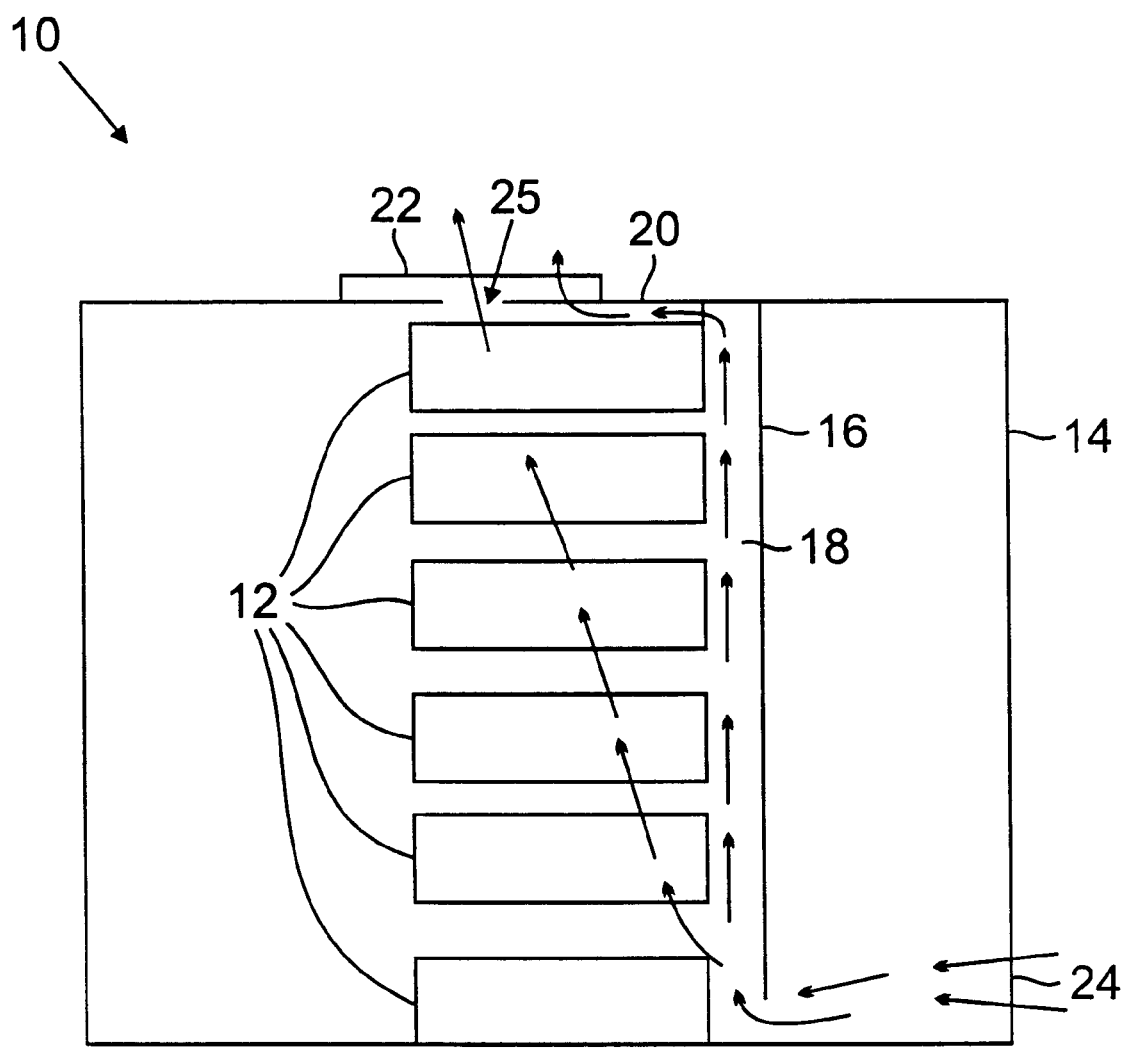
FIG. 1 is a diagrammatical sketch of an electrical cabinet according to the PRIOR ART.

Referring now to FIG. 1, cabinet 10 according to the PRIOR ART is shown. Air flow in the cabinet 10 is represented by the arrows within the cabinet 10. The cabinet 10 has a plurality of compartments 12 disposed in an interior of the cabinet 10. The interior is configured to house electrical components. The cabinet 10 has a top surface 20 with an aperture 25 formed therethrough. A fan 22 is mounted to the top surface 20 of the cabinet 10 over the aperture 25 in the cabinet 10, such fan 22 being adapted to produce a flow of air through the interior of the cabinet 10 and to exhaust such flow of air externally of the cabinet. An interior door 16 is disposed between the plurality of compartments 12 and the exterior door 14. The interior door 16 and the plurality of compartments 12 define a chimney 18. The air that the fan 22 draws into the cabinet 10 through the exterior door 14 is drawn into the chimney 18 in an attempt to cool the components stored in the plurality of compartments 12. The air follows the lowest impedance path available. The chimney 18 is a very low impedance path. Thus, the air flows up through the chimney 18 and out the fan 22 following the path of least resistance in the cabinet 10. As such, the flow of air does not optimally cool the electrical components stored within the plurality of compartments 12.

Figure 2:
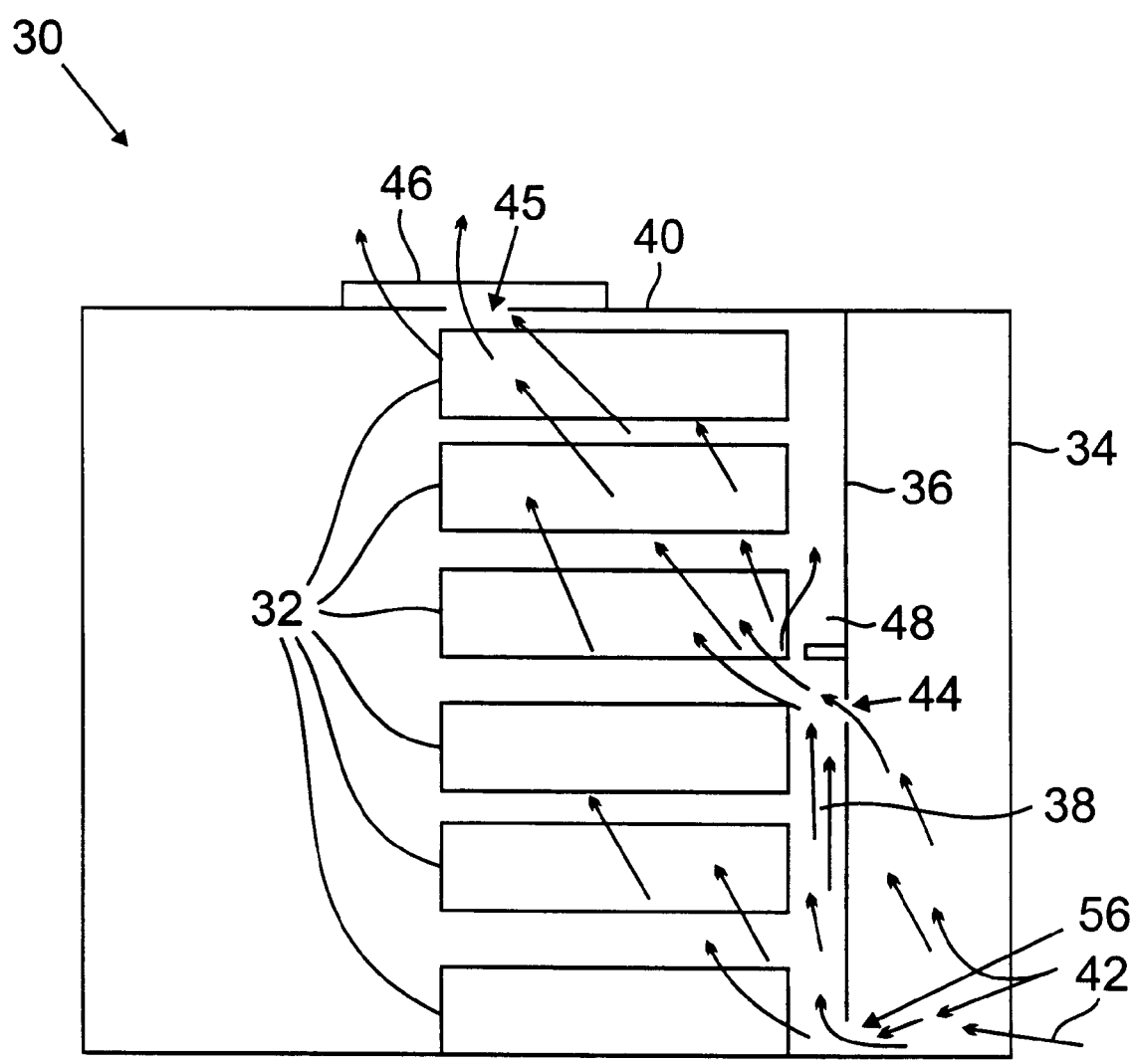
FIG. 2 is a diagrammatical sketch of an electrical cabinet according to the invention.

Referring now to FIG. 2, a cabinet 30 according to the invention, is shown. The cabinet 30 has a plurality of compartments 32 disposed in an interior of the cabinet 30. The interior is configured to house electrical components in the plurality of compartments 32. A surface, here a top surface 40, of the cabinet 30 has an exhaust aperture 45 formed therethrough. A fan 46 is mounted in registration with the exhaust aperture 45. The fan 46 is adapted to produce a flow of air through the interior of the cabinet 30 when operating properly to exhaust such flow of air externally from the cabinet 30.

The cabinet 30 has an outer door 34. Air flow in the cabinet 30 is represented by the arrows within the cabinet 30. The outer door 34 is adapted to allow air to enter the cabinet 30 through an aperture 42 in said outer door 34. The interior door 36 and the plurality of compartments 32 define a chimney 38. After the air is drawn through the aperture 42 in the outer door 34 the air enters the chimney 38. The air enters the chimney 38 via the intake aperture 44 in the interior door 36 and a gap 56 below the interior door 36.

The air flows up the chimney 38 and is inhibited from continuing up the chimney 38 by the air dam 48. The air dam 48 is positioned higher on the door than the intake aperture 45, thus positioning the air dam 48 closer to the exhaust aperture 45. The air dam 48 is mounted to the interior door 36 and extends out perpendicularly from the interior door 36 towards the plurality of compartments 32 in the interior of the cabinet 30. The air dam 48 impedes, or inhibits, the flow of the air up the chimney 38 and redirect such flow of air through the plurality of compartments housing the electrical components, thus increasing the airflow among the plurality of compartments 32. With such an arrangement, the air will more effectively circulate among the contents of the plurality of compartments 32 cooling them.

Figure 7A:
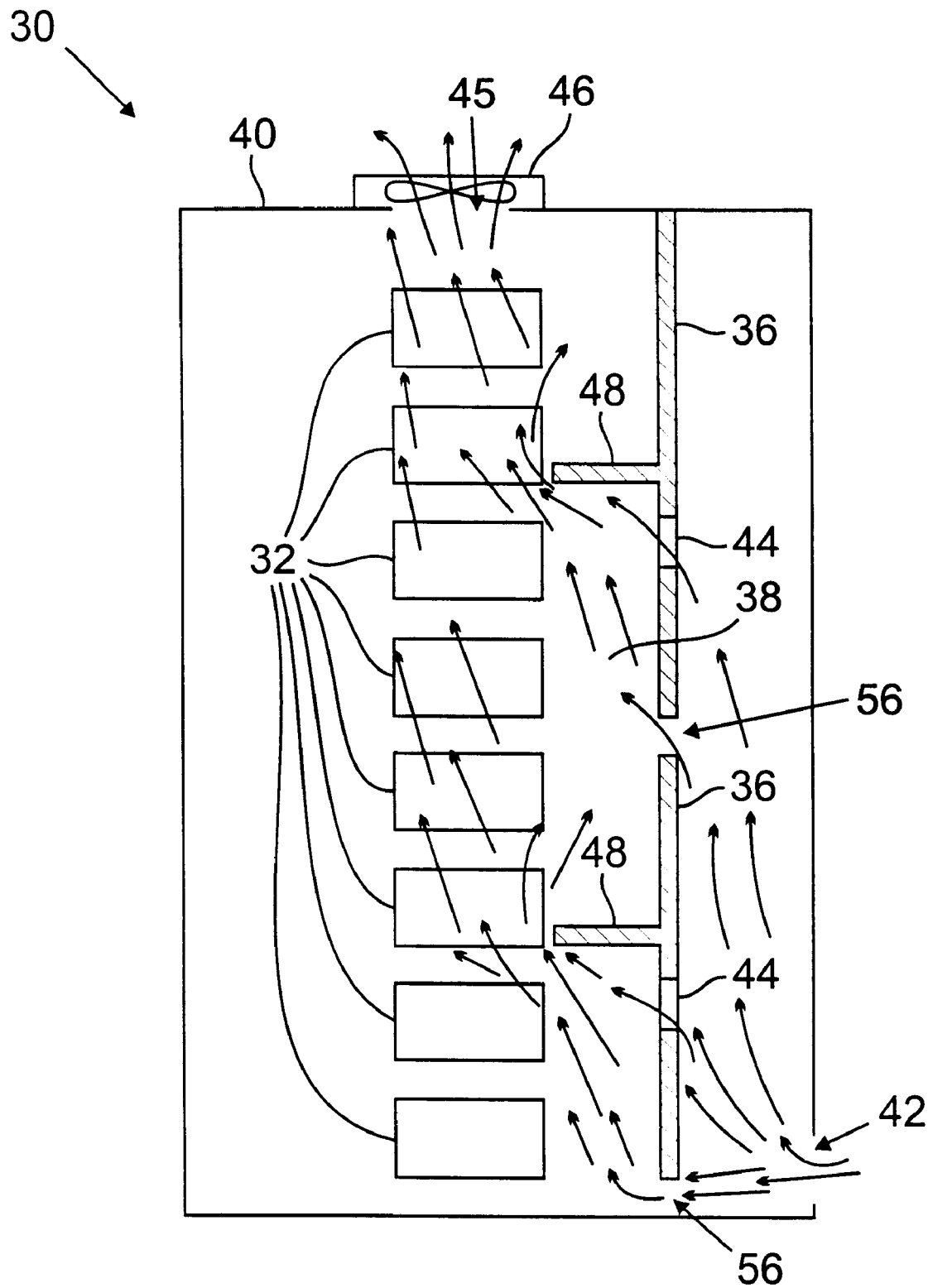
FIGS. 7A and 7B are diagrammatical sketches of alternative embodiments of the invention.
Figure 7B:
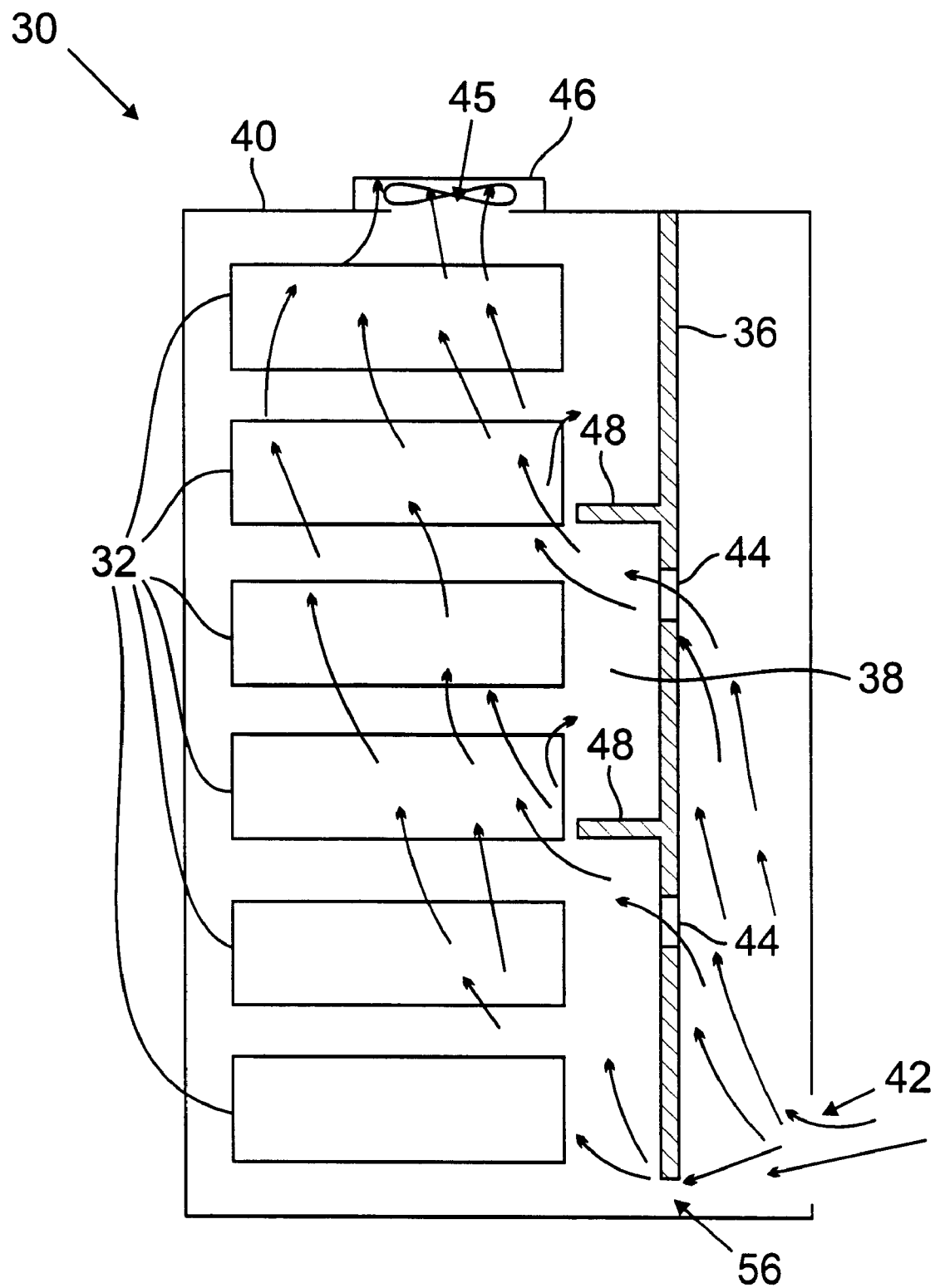

It should be understood that multiple interior doors can be used. Using multiple doors or multiple intake apertures and air dams in the same door supplies different compartments in a cabinet with increased air flow, as shown in FIGS. 7A and 7B, where the same or equivalent elements are designated with the same numerical designation. In particular, the air can also pass through one of the plurality of compartments 32. Eventually after the air has circulated through the interior of the cabinet 30 it exits through the exhaust aperture 45.

Figure 3:
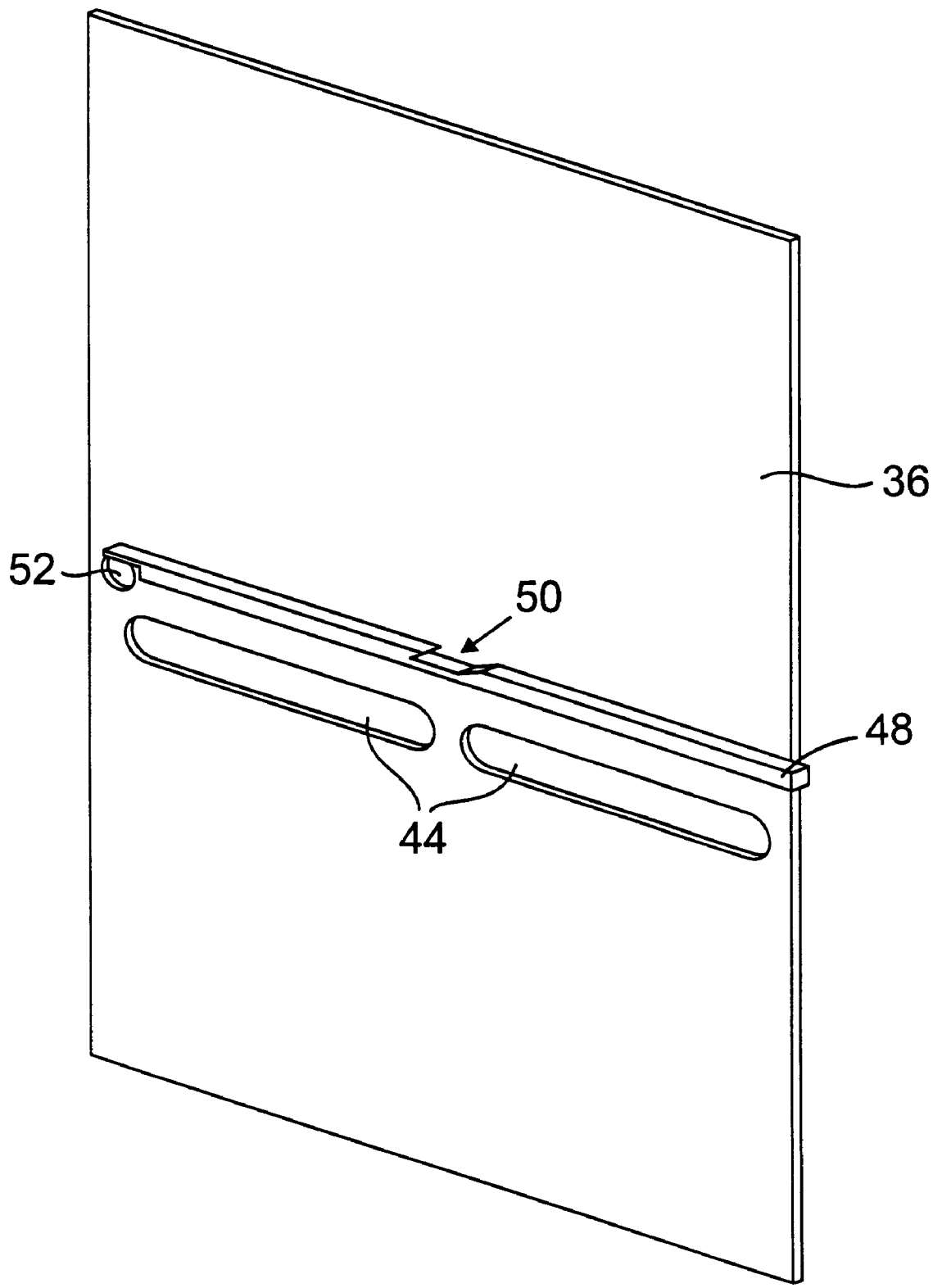
FIG. 3 is a perspective view of an internal door used in the cabinet of FIG. 2.

Referring now also to FIG. 3, the interior door 36 is made of a rigid material, here transparent clear polycarbonate, 0.236 inches thick. The interior door 36 has two intake apertures 44 formed therethrough to allow the free flow of air through the interior door 36. The interior door 36 has the air dam 48 mounted on one side of the interior door 36. The air dam 48 extends out from the interior door 36, here perpendicularly, spanning the chimney 38 to the plurality of compartments 32. The air dam 48 is adapted to impede air from flowing through the chimney 38, shown in FIG. 2. Thus, the air dam 48 increases the impedance the chimney 38 to incoming air, causing the air flow to divert more air through the plurality of components 32.

The air dam has a notch 50 in it to accommodate a strut, not shown, which extends down the middle of the front of the plurality of compartments 32. The strut helps maintain the structural integrity of the plurality of compartments 38. The interior door 36 also has a circular aperture 52 formed therethrough. The aperture 52 is adapted to accommodate a locking mechanism for holding the interior door 36 closed.

Figure 4:
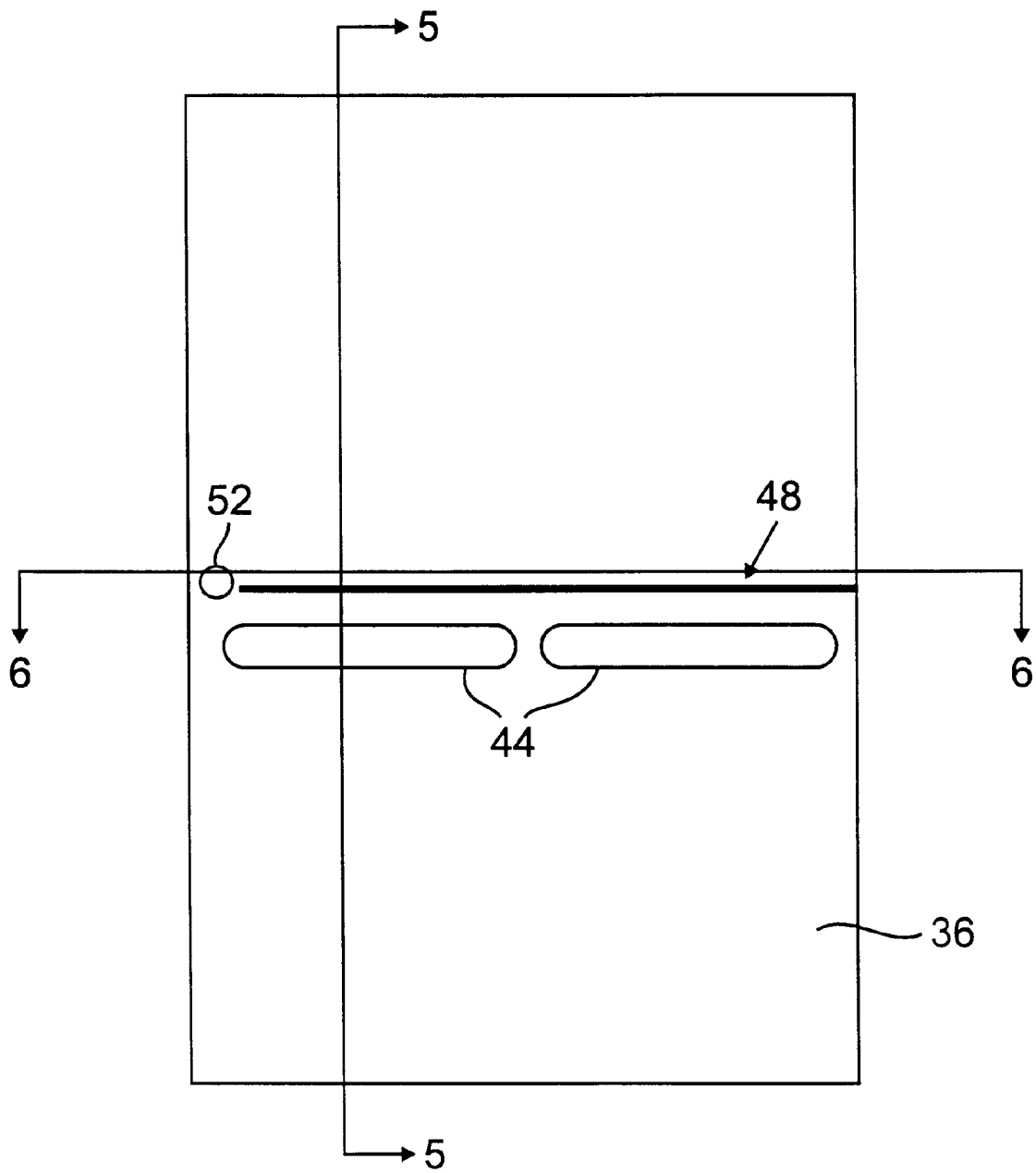
FIG. 4 is a plan front view of the internal door of FIG. 3.

Referring to FIG. 4, the interior door 36 has an aperture 52 formed therethrough, adapted to accommodate a locking mechanism for holding the interior door 36 closed. The locking mechanism substantially fills the space 54. The air dam 48 is mounted to the interior door 36 on the side of the interior door 36 facing the plurality of compartments 32, shown in FIG. 2. The air dam 48 has a semi-circular indent 50 in the middle of the air dam 48 to accommodate the strut, not shown, which extends down the middle of the front of the plurality of compartments 32, shown in FIG. 2.

Figure 5:
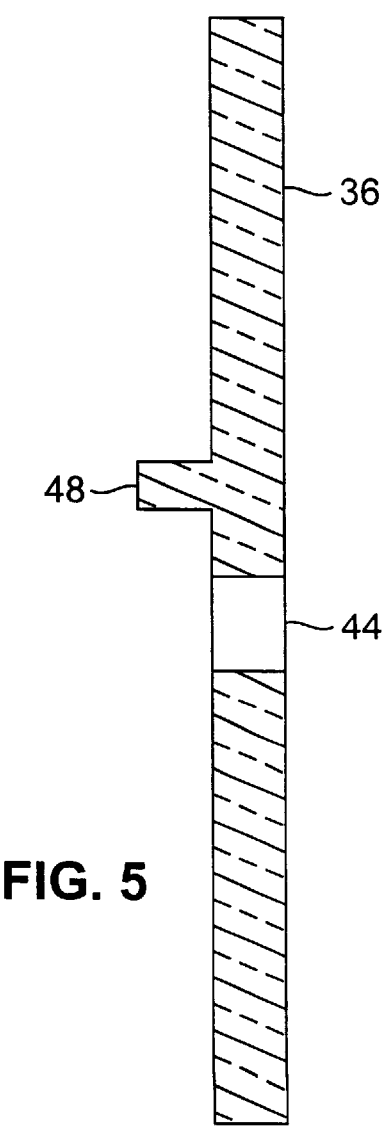
FIG. 5 is a cross-sectional view of the internal door of FIG. 4, such cross section being taken along line 5—5 in FIG. 4.

Referring now to FIG. 5, the interior door 36 with air dam 48 mounted is shown with the air dam 48 extending, here perpendicularly, toward the plurality of compartments 32, shown in FIG. 2. The interior door 36 has two intake apertures 44 formed therethrough, to allow the free flow of air through the interior door 36.

Figure 6:
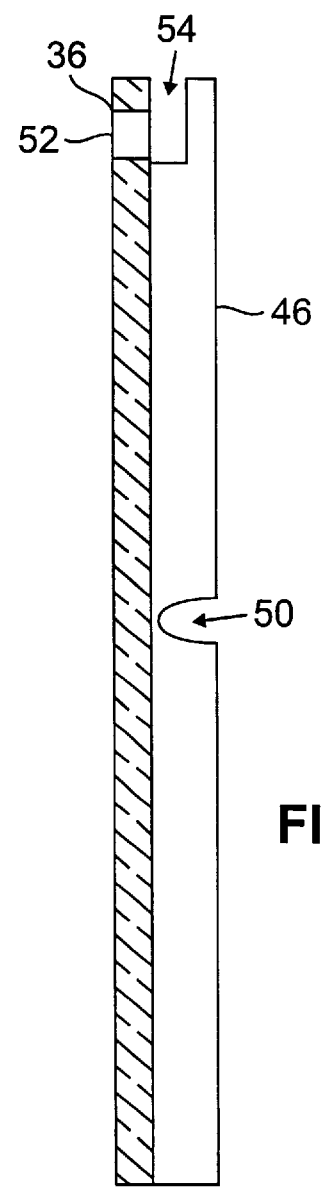
FIG. 6 is a cross sectional view of the internal door of FIG. 4, such cross section being taken along line 6—6 in FIG. 4.

Referring now also to FIG. 6, the interior door 36 is shown with a pair of intake apertures 44 formed therethrough. The intake apertures 44 allow air to flow through the interior door 36. The interior door 36 has the air dam 48 attached to it on the side of the interior door 36 that faces the plurality of compartments 32, shown in FIG. 2. The interior door 36 also has the aperture 52 formed therethrough. The aperture 52 is adapted to accommodate a locking mechanism to hold the interior door 36 closed.

Other embodiments are within the spirit and scope of the appended claims.

What is claimed is:

1. A cabinet, comprising:

a plurality of compartments disposed in an interior of the cabinet, such interior being configured to house electrical components;

a surface of the cabinet having an exhaust aperture formed therethrough;

a fan adapted to produce a flow of air through the interior of the cabinet, such flow of air exhausted out of the cabinet through the exhaust aperture; and at least one door disposed adjacent to the plurality of compartments, such door comprising:
 a first intake aperture formed therethrough;
 a first air dam, positioned closer to the first intake aperture than the exhaust aperture, said first air dam extending out from the door toward said plurality of compartments, the first air dam positioned to inhibit the flow of air along the door;
 a second intake aperture formed therethrough;
 a second air dam, positioned closer to the second intake aperture than the exhaust aperture, said second air dam extending out from the door toward said plurality of compartments, the second air dam positioned to inhibit the flow of air along the door.

2. The cabinet recited in claim 1 wherein the cabinet includes an exterior door, such first-mentioned door being positioned between the exterior door and the compartments.

3. The cabinet recited in claim 2 wherein the first and second air dams project into a region disposed between the first-mentioned door and the compartments.

4. The cabinet recited in claim 3 wherein the exterior door has an opening therethrough to enable air to enter such opening and pass through the region between the first-mentioned door and also through a region between the first-mentioned door and the exterior door with a portion of the air in the region between the exterior door and the first-mentioned door passing through the first and second intake apertures into the region between the first-mentioned door and the exterior door.

* * * * *